United States Patent
Rao et al.

(10) Patent No.: US 9,293,388 B2
(45) Date of Patent: Mar. 22, 2016

(54) RELIABLE PASSIVATION LAYERS FOR SEMICONDUCTOR DEVICES

(71) Applicant: GLOBALFOUNDRIES Singapore Pte. Ltd., Singapore (SG)

(72) Inventors: Xuesong Rao, Singapore (SG); Meng Meng Vanessa Chong, Singapore (SG); Chim Seng Seet, Singapore (SG); Hendro Mario, Singapore (SG); Aison John George, Singapore (SG); Chor Shu Cheng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 128 days.

(21) Appl. No.: 14/060,582

(22) Filed: Oct. 22, 2013

(65) Prior Publication Data

US 2015/0108654 A1    Apr. 23, 2015

(51) Int. Cl.
*H01L 21/4763*    (2006.01)
*H01L 23/31*    (2006.01)
*H01L 21/768*    (2006.01)

(52) U.S. Cl.
CPC ...... *H01L 23/3192* (2013.01); *H01L 21/76802* (2013.01); *H01L 2924/0002* (2013.01)

(58) Field of Classification Search
CPC ............... H01L 21/76802; H01L 2924/00014; H01L 21/76877; H01L 2924/00; H01L 2924/0002
USPC .................................................. 438/637, 629
See application file for complete search history.

(56) References Cited

U.S. PATENT DOCUMENTS

| | | | |
|---|---|---|---|
| 6,358,862 B1 * | 3/2002 | Ireland et al. ................. | 438/758 |
| 2001/0051423 A1 * | 12/2001 | Kim et al. ..................... | 438/624 |
| 2005/0074964 A1 * | 4/2005 | Lo et al. ........................ | 438/624 |
| 2006/0138673 A1 * | 6/2006 | Kim .............................. | 257/779 |

* cited by examiner

*Primary Examiner* — Andy Huynh
(74) *Attorney, Agent, or Firm* — Horizon IP Pte. Ltd.

(57) ABSTRACT

Device and method for forming a device are disclosed. A substrate which is prepared with a dielectric layer having a top metal level of the device is provided. The top metal level includes top level conductive lines. A top dielectric layer which includes top via openings in communication with the top level conductive lines is formed over the top metal level. A patterned top conductive layer is formed on the top dielectric layer. The patterned top conductive layer includes a top via in the top via opening and a top conductive line. A first passivation sub-layer is formed to line the patterned conductive layer and exposed top dielectric layer. A plasma treatment is performed on the surface of the first passivation sub-layer to form a nitrided layer. A second passivation sub-layer is formed to line the nitrided layer. The plasma treatment improves the passivation integrity of the passivation stack.

20 Claims, 8 Drawing Sheets

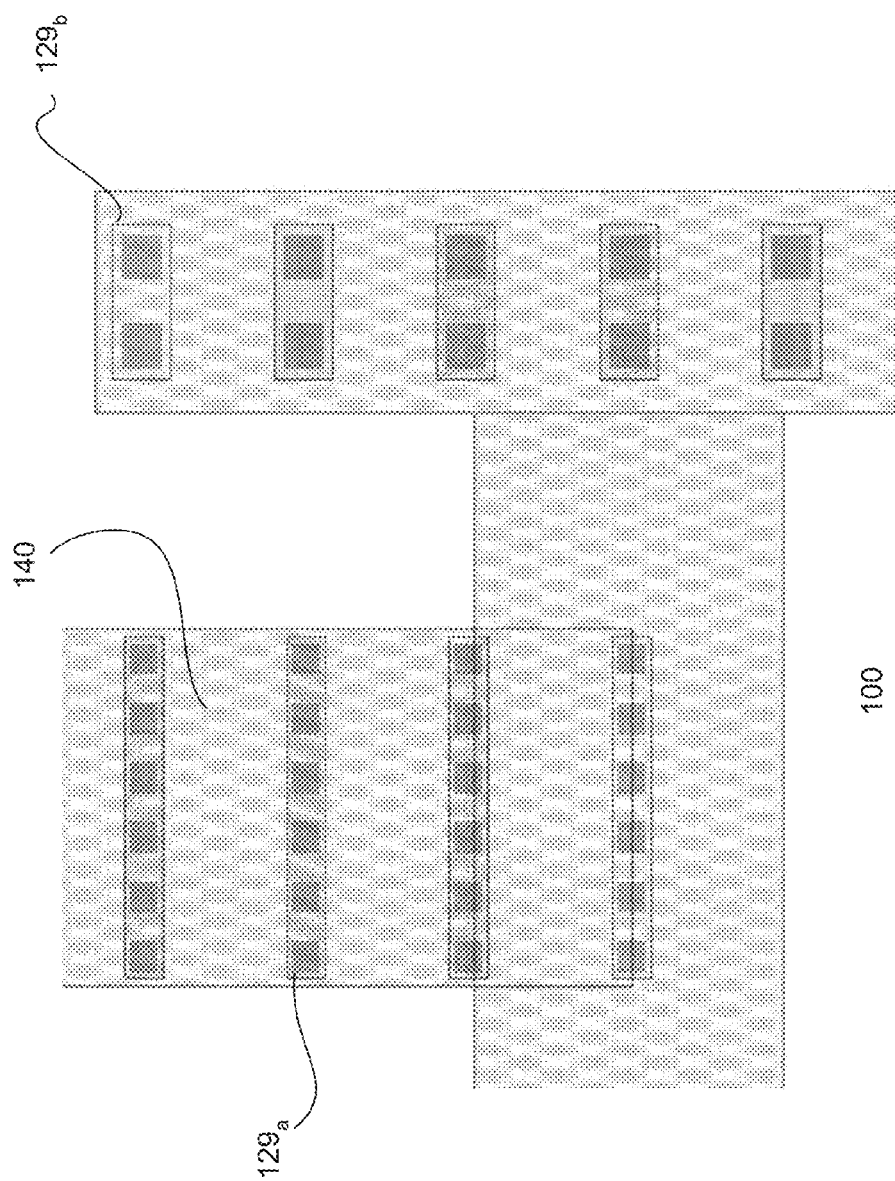

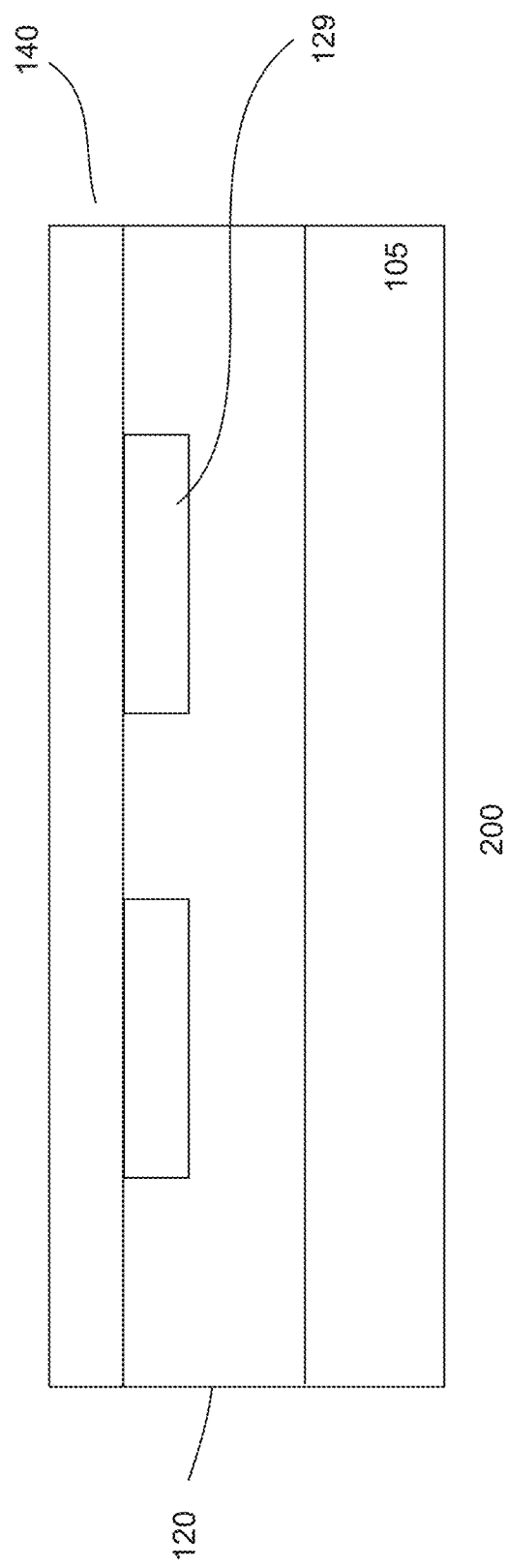

US 9,293,388 B2

RELIABLE PASSIVATION LAYERS FOR SEMICONDUCTOR DEVICES

BACKGROUND

Passivation layers are generally employed in semiconductor manufacturing to protect metal layers, such as the final metal layer, from mechanical and chemical damage during assembly. However, current passivation layers fail to provide effective protection to the underlying metal layer.

Therefore, it is desirable to provide reliable passivation layers which can effectively protect the underlying metal layer. Furthermore, it is also desirable to provide simplified method to produce such passivation layer.

SUMMARY

Embodiments generally relate to semiconductor device and method of forming semiconductor device. In one embodiment, a method for forming a semiconductor device is disclosed. The method includes providing a substrate. The substrate is prepared with a dielectric layer which includes a top metal level of the device. The top metal level includes top level conductive lines. A top dielectric layer is formed over the top metal level. The top dielectric layer includes top via openings in communication with the top level conductive lines. A patterned top conductive layer is formed on the top dielectric layer. The patterned top conductive layer includes a top via in the top via opening and a top conductive line. A passivation stack is formed. A first passivation sub-layer is formed to line the patterned conductive layer and exposed top dielectric layer. A plasma treatment is performed on the surface of the first passivation sub-layer to form a nitrided layer on the first passivation sub-layer. A second passivation sub-layer is formed to line the nitrided layer. The plasma treatment improves the passivation integrity of the passivation stack.

In another embodiment, a method for forming a semiconductor device is presented. The method includes providing a substrate prepared with a top dielectric layer which includes top via openings. A patterned top conductive layer is formed on the top dielectric layer. The patterned top conductive layer includes a top via in the top via opening and a top conductive line. The patterned top conductive layer serves as an external contact of the semiconductor device for coupling to an external substrate. A passivation stack is formed. At least a first passivation sub-layer is formed to line the patterned conductive layer and exposed top dielectric layer. A plasma treatment is performed on the surface of the first passivation sub-layer to form a nitrided layer on the first passivation sub-layer.

In yet another embodiment, a semiconductor device is disclosed. The device includes a substrate having a dielectric layer which includes a top metal level of the device. The top metal level includes top level conductive lines. A top dielectric layer is disposed over the top metal level. The top dielectric layer includes top via openings in communication with the top level conductive lines. A patterned top conductive layer is disposed on the top dielectric layer. The patterned top conductive layer includes a top via in the top via opening and a top conductive line. The device includes a passivation stack. The passivation stack includes a first passivation sub-layer which lines the patterned conductive layer and exposed top dielectric layer, a second passivation sub-layer which is disposed over the first passivation sub-layer, and a nitrided layer sandwiched between the first and second passivation sub-layers.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1b shows a plan view of a portion of a device; and

FIGS. 2a-f show an embodiment of a process of forming a device.

DETAILED DESCRIPTION

Embodiments generally relate to devices, such as semiconductor devices or ICs. Other types of devices, such as micro electro-mechanical systems (MEMS), liquid crystal displays, are also useful. The ICs can be any type of IC, for example dynamic or static random access memories, signal processors, or system-on-chip devices. The ICs can be incorporated into, for example, consumer electronic products, such as computers, cell phones, and personal digital assistants (PDAs).

A plurality of devices are fabricated on a wafer in parallel. The wafer, for example, is a semiconductor wafer, such as a silicon wafer. Other types of wafers are also useful. For example, the wafer may be a p-type, n-type, silicon-on-insulator or silicon germanium wafer. The wafer may include an active surface on which devices are formed. The devices, for example, are arranged in rows along a first (x) direction and columns along a second (y) direction. The devices are separated by scribe lines or regions in the first and second directions. After processing of the wafer is completed, a dicing tool cuts the wafer along the scribe lines to singulate the devices. The devices may be further processed, such as assembly and testing to complete the devices.

Figure 1A:
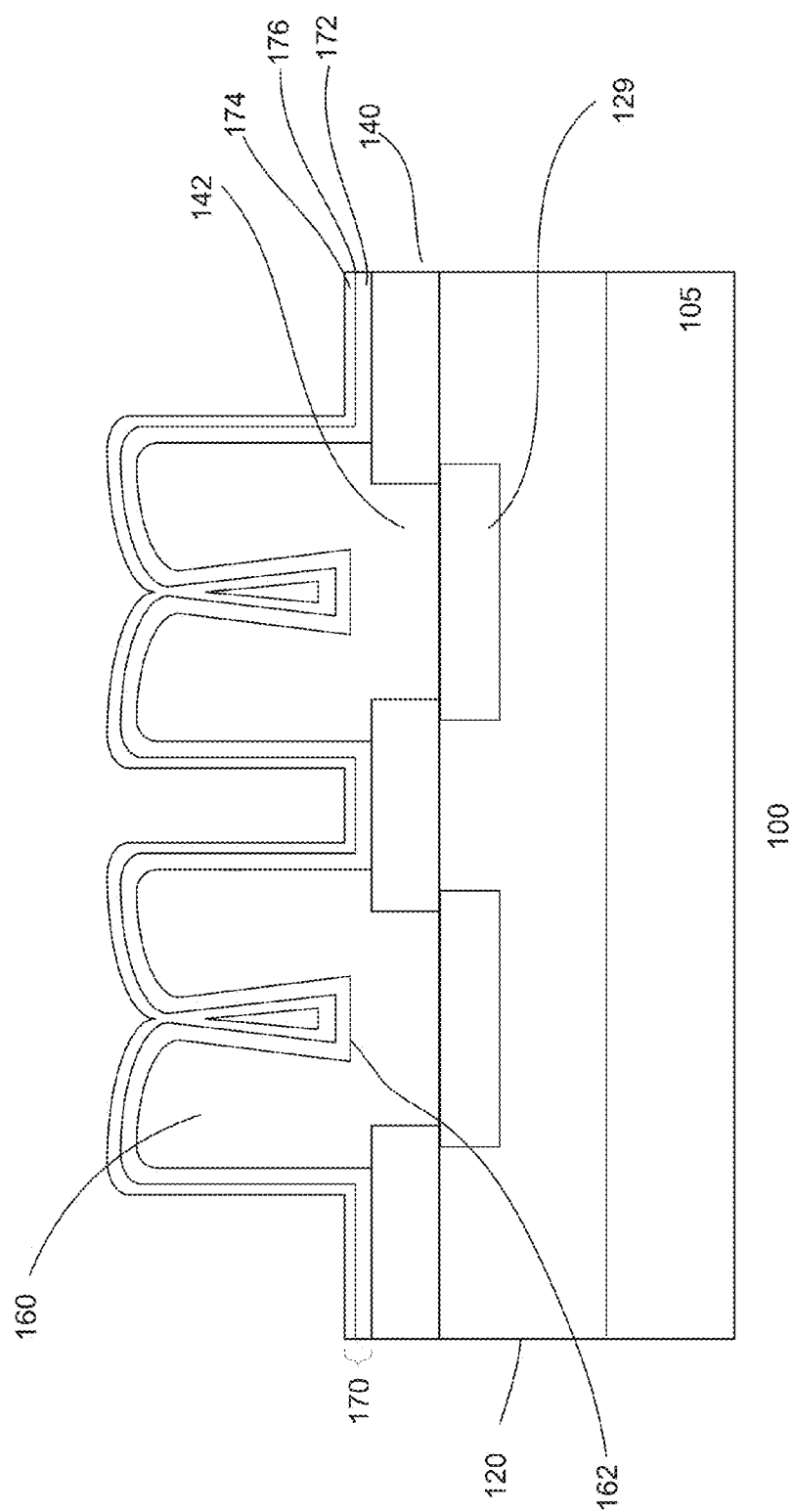
FIG. 1a shows a cross-sectional view of a portion of a device.

FIG. 1a shows a cross-sectional view of a portion 100 of a substrate 105. The substrate may be a semiconductor wafer, such as a silicon wafer. Other types of wafers or substrates may also be useful. As shown, the substrate includes a portion of a device. The substrate, for example, includes circuit components (not shown) formed on the substrate surface.

The circuit components, for example, may include transistors as well as other components. The circuit components may be interconnected by interconnects formed in a dielectric layer 120 disposed over the substrate. The dielectric layer may include multiple interconnect or metal levels. For example, the dielectric layer includes interconnect levels M1-Mx, where M1 is the lowest metal level and Mx is the uppermost metal level. Contacts may be used to couple interconnects of, for example, adjacent metal levels or interconnects to the circuit components. The contact level that couples circuit components to interconnects of the first metal level M1 is referred to as CA, while other contact levels disposed between adjacent metal levels are via levels V1-Vx−1. Typically, a device may have about 3-7 (e.g., x=3-7) metal levels. Providing devices with other number of metal levels may also be useful. Illustratively, interconnects 129 of the Mx level are shown in the dielectric layer. The Mx level, as discussed, is the uppermost metal level.

The dielectric layer may include multiple dielectric layers which serve as inter-level dielectric (ILD) layers. An ILD layer may include a metal and via level. Etch stop layers may be provided between ILD layers. Other configuration of ILD or dielectric layers may also be useful. The contacts and interconnects may be formed by damascene or dual damascene techniques. Damascene technique includes forming openings in a dielectric layer which are filled with conductive material. Excess conductive material is removed by, for example, polishing. This forms contacts in the contact level or interconnects in the metal level. Dual damascene technique includes forming in the dielectric layer both openings corresponding to contact openings and trench openings corresponding to interconnects, which are filled by a conductive material. Excess conductive material is removed by, for example, polishing. This forms contacts and interconnects in a single process.

In some cases, the contacts and interconnects may be formed by a combination of damascene and dual damascene techniques. For example, the CA and M1 levels are formed using damascene techniques while the other levels are formed using dual damascene techniques. Other techniques or combination of techniques may be employed to form the contact and interconnect levels. In the case of a dual damascene process, the conductive material of the contacts and interconnects are the same. On the other hand, damascene processes allow for the use of different conductive materials for contacts and interconnects. The interconnects and contacts for the upper metal levels (e.g., M1-Mx and V1-Vx−1) may be copper (Cu) or Cu alloy while tungsten may be used for contacts in the CA level. Other configurations of contact and interconnect materials may also be useful.

A top dielectric layer 140 is disposed above the dielectric layer 120 and the top metal level. The top dielectric layer, for example, may be silicon oxide. Other types of dielectric layers may also be useful. Top via openings, for example, are provided in the top dielectric layer. The top via openings are in communication with the conductive lines or interconnects 129 in the top metal level. The via openings for example, may be cylindrical shaped with sides of about 2-3 μm in length. The spacing of the via openings may be about 2-3 μm apart. Other suitable types of shapes for the via openings, dimensions or spacings may also be useful.

Disposed above the top dielectric layer is a patterned top conductive layer 160. In one embodiment, the top conductive layer is aluminum (Al). Other types of conductive materials may also be useful to serve as the top conductive layer. The top conductive layer fills the top via openings to form top vias 142 and includes top conductive lines and conductive pads. The thickness of the top conductive layer, for example, may be about 6,000-28,000 Å. Other suitable thickness ranges for the top conductive layer may also be useful, depending on the design requirements. The pads, for example, serve as external contacts for the device or IC chip for coupling to a separate or external substrate, such as a printed circuit board (PCB). The top conductive layer includes voids 162 above the vias. The voids result from the formation of the conductive layer on the top dielectric layer.

A dielectric passivation layer 170 is disposed over the patterned top conductive layer and exposed top dielectric layer. In one embodiment, the passivation layer is a passivation stack, which includes first and second passivation sub-layers 172 and 174. The first passivation sub-layer is disposed over the patterned top conductive layer and exposed top dielectric layer while the second passivation sub-layer is disposed thereover. In one embodiment, the first passivation sub-layer includes silicon oxide and the second passivation sub-layer includes silicon nitride. Other suitable types of sub-layers may also be useful.

The dielectric stack should be sufficiently thick to passivate the patterned top conductive layer. For example, the dielectric stack may be about 10,000-20,000 Å. In one embodiment, the silicon oxide layer is about 6,000-14,000 Å and the silicon nitride layer is about 4,000-10,000 Å. Other suitable thicknesses for the stack or sub-layers may also be useful. In one embodiment, the top surface of the silicon oxide layer includes a thin nitrided silicon oxynitride or silicon nitride layer 176. This thin nitrided layer is sandwiched by the first and second passivation sub-layers.

In one embodiment, the nitrided layer is provided by a plasma surface treatment of the silicon oxide layer. In one embodiment, the nitrided layer is provided by a nitrogen containing plasma, such as $N_2$ or $NH_3/N_2$. Other types of nitrogen containing plasma may also be useful. The thickness of the nitrided layer varies, for example, depending on the parameters of the plasma treatment. The nitrided layer improves passivation by the passivation stack. This prevents, for example, corrosion or contamination of the top conductive layer, improving device reliability.

FIG. 1b shows an exemplary top view of the device 100. The top view, for example, is of the top dielectric layer 140. As shown, the top dielectric layer includes first and second via arrays 129a and 129b. The first via array includes rectangular shaped vias having sides with lengths of about 2 μm and spacing of about 2 μm; the second via array includes rectangular shaped vias having sides with lengths of about 3 μm and spacing of about 3 μm. Other via shapes, dimensions and spacings may also be useful.

Figure 2B:
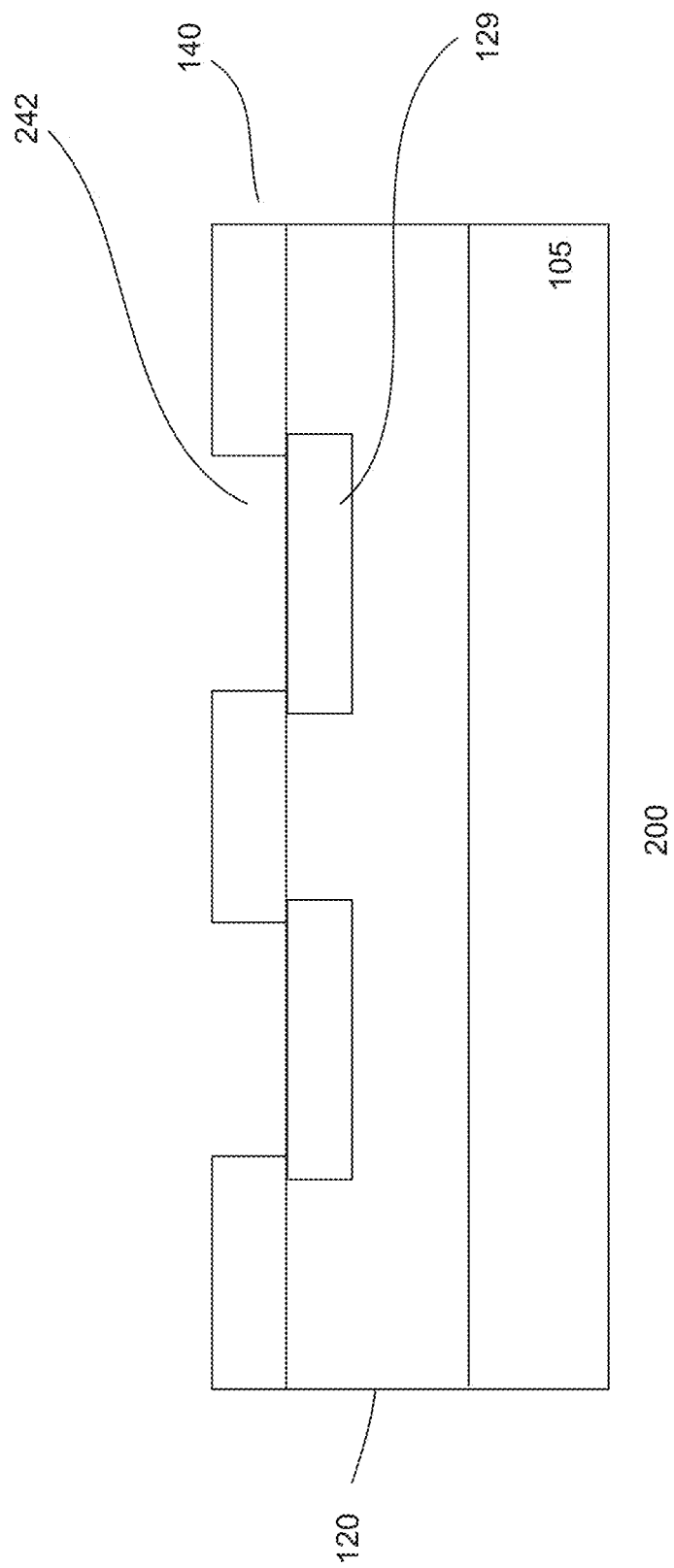

FIGS. 2a-f shows an embodiment of a process 200 for forming a device. The device may be similar to that described in FIGS. 1a-b. Common elements may not be described or described in detail. Referring to FIG. 2a, a substrate 105 is provided. The substrate may be a semiconductor wafer, such as a silicon wafer. Other types of wafers or substrates may also be useful. As shown, the substrate includes a portion of a device. The substrate, for example, includes circuit components (not shown) formed on the substrate surface.

A dielectric layer 120 is disposed on the substrate surface, covering the circuit components. As shown, the dielectric layer includes interconnects 129. The interconnects are disposed in the top metal level Mx of the device. The dielectric layer may include other metal and contact levels (not shown). For example, the dielectric layer includes M1-Mx, CA and V1-Vx−1.

A top dielectric layer 140 is formed on the top metal level. The top dielectric layer, for example, may be silicon oxide. Other suitable types of dielectric layers, such as but not limited to doped silicon oxide, doped silicon nitride or low k dielectric materials, may also be useful. Various techniques may be used to form the dielectric layer. For example, the dielectric layer may be formed by chemical vapor deposition (CVD). Other suitable deposition techniques may also be useful.

Referring to FIG. 2b, the top dielectric layer is patterned to form top via openings 242. The top via openings are in communication with the conductive lines 129 in the top metal level. The via openings for example, may be cylindrical shaped via openings with sides of about 2-3 μm in length. The spacing of the via openings may be about 2-3 μm apart. Other suitable shapes for the via openings, dimensions or spacings may also be useful.

Patterning the top dielectric layer to form the top via openings may be achieved by, for example, mask and etch techniques. For example, an anisotropic etch, such as reactive ion etch (RIE), is employed using a patterned soft mask, such as photoresist, as an etch mask to pattern the top dielectric layer. To improve lithographic resolution, an anti-reflective coating (ARC) can be provided beneath the photoresist. Other techniques for patterning the top dielectric layer may also be useful. After patterning the top dielectric layer, the mask, including the ARC is removed.

Figure 2C:
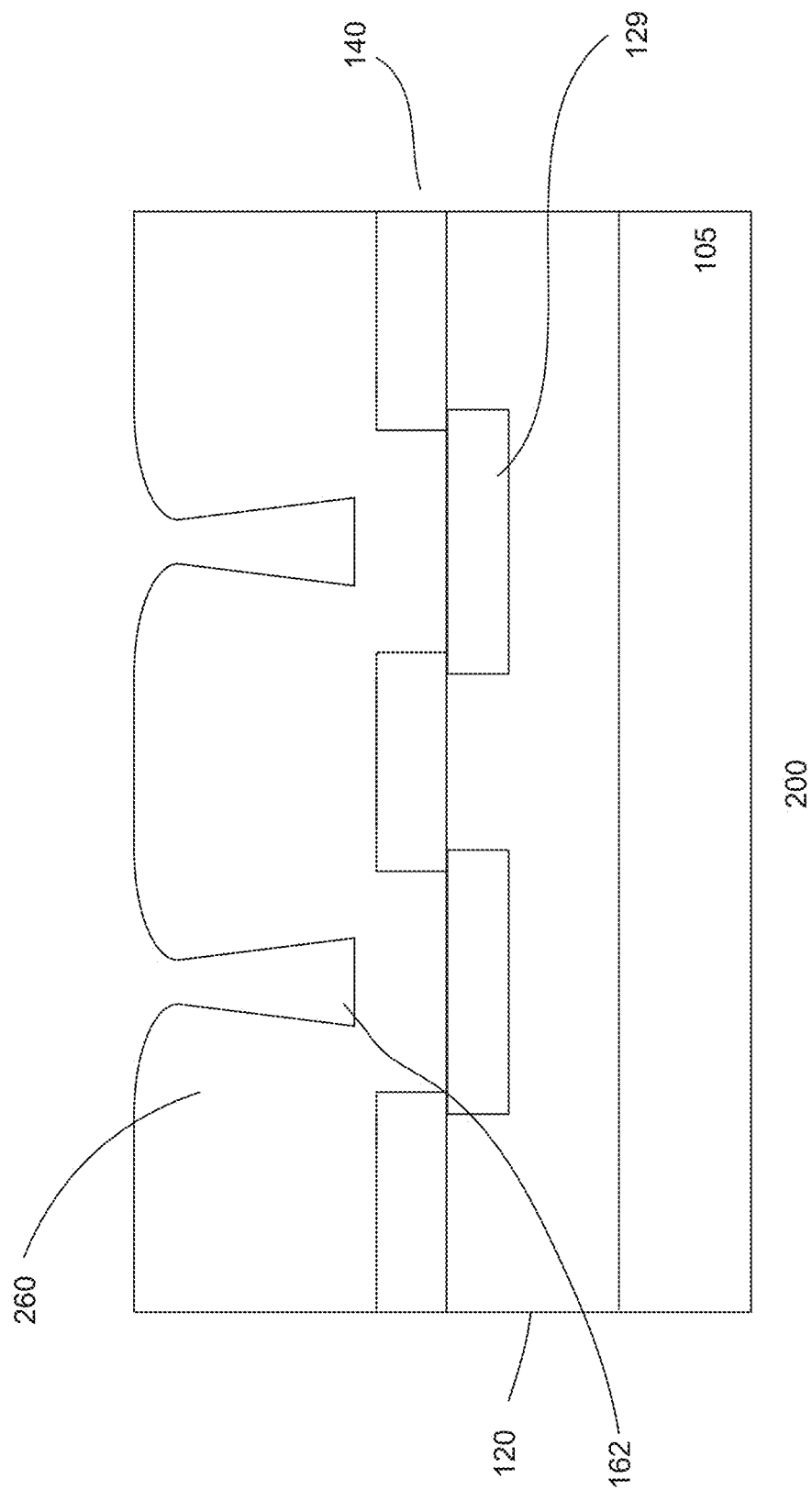

In FIG. 2c, a top conductive layer 260 is formed on the substrate. In one embodiment, the top conductive layer is aluminum. Other suitable types of conductive materials may also be useful to serve as the top conductive layer. The top conductive may be formed by sputtering. Other techniques for forming the top conductive layer may also be useful. The top conductive layer fills the top via openings and covers the top dielectric layer. The top conductive layer should be sufficiently thick to form conductive lines and pads. For example, the top conductive layer may be about 6,000-28,000 Å thick. Other suitable thickness ranges may also be useful. The top conductive layer includes voids 162 above the vias. The profile results from the formation of the conductive layer on the top dielectric layer.

Figure 2D:
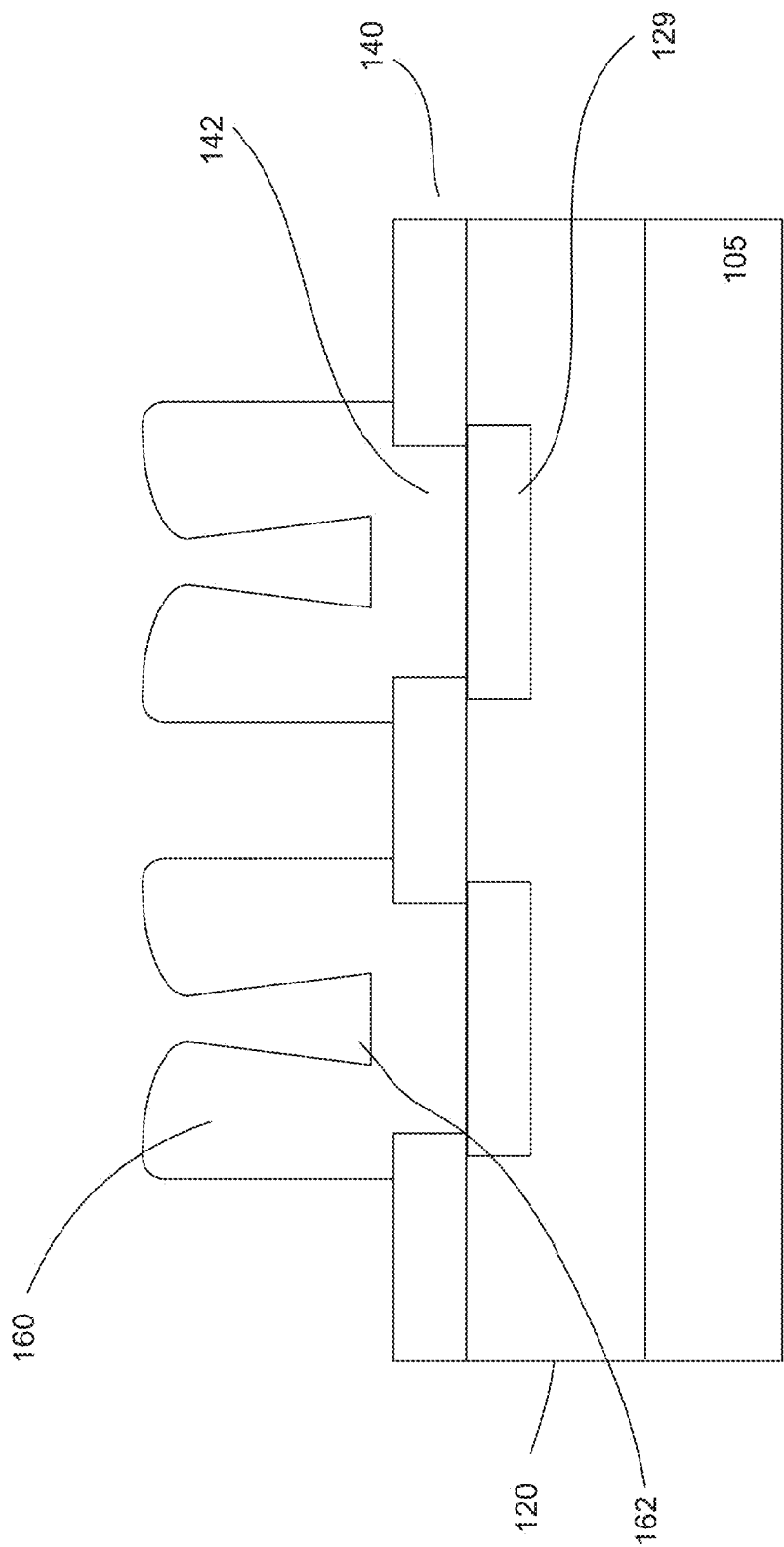

The top conductive layer is patterned to form conductive lines and pads, as shown in FIG. 2d. The pads 160, for example, serve as external contacts for the device. The conductive lines couple the pads to the interconnects in the top interconnect level. Patterning the top conductive layer may be achieved by, for example, mask and etch techniques, similar to that described with respect to patterning the top dielectric layer. Other techniques for patterning the top conductive layer may also be useful. After patterning the top conductive layer, the mask, including the ARC, is removed.

Figure 2E:
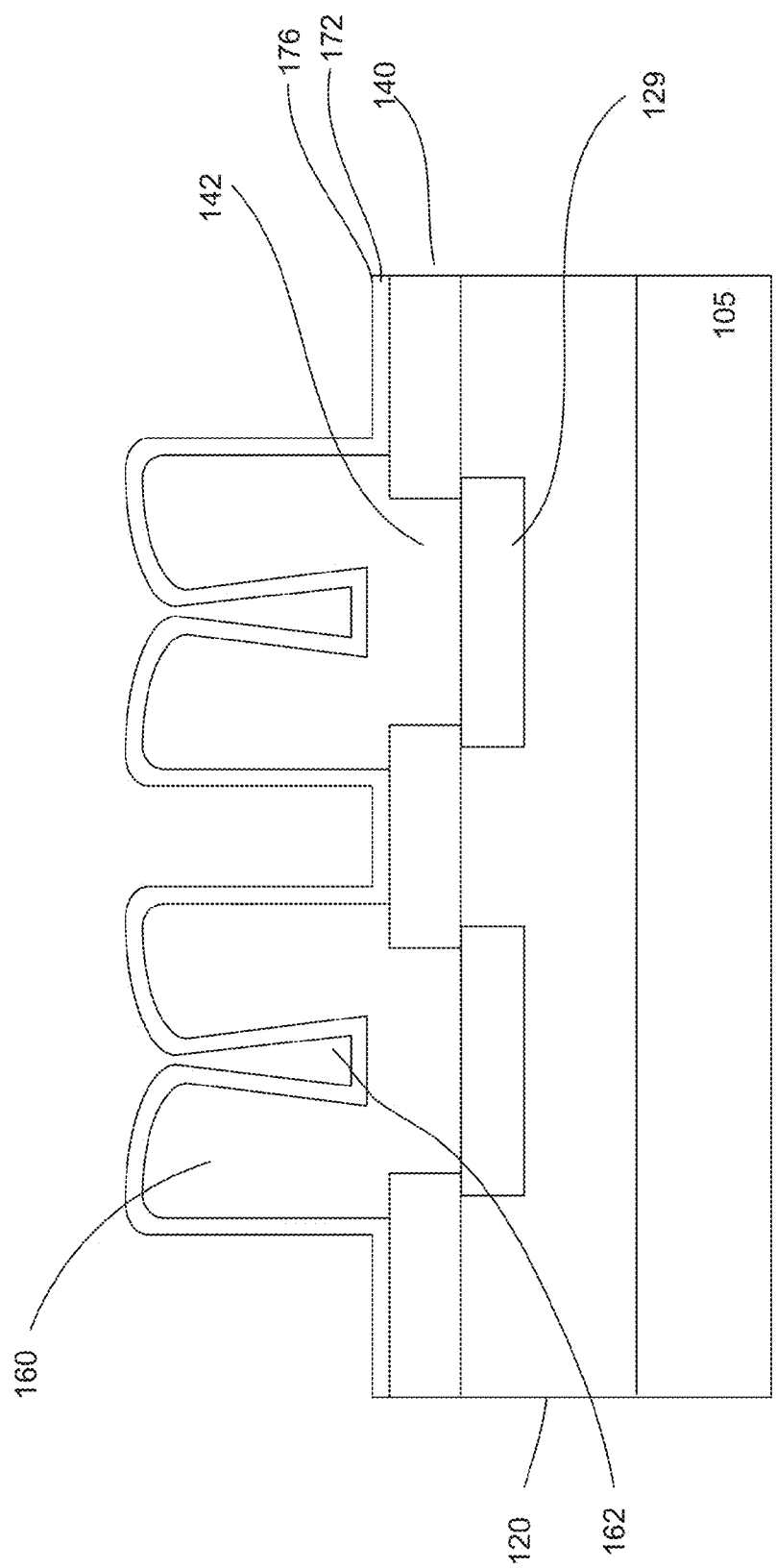

Referring to FIG. 2e, a first dielectric passivation sub-layer 172 is formed on the substrate. The first passivation sub-layer should have sufficient thickness and lines the patterned top conductive layer and exposed top dielectric layer, with or without filling or sealing the void. The first passivation sub-layer, for example, is about 6,000-14,000 Å. Providing a first passivation sub-layer of other suitable thicknesses may also be useful so long as it is sufficiently thick to passivate the exposed top conductive layer. In one embodiment, the first passivation sub-layer is part of a passivation stack. In one embodiment, the first passivation sub-layer is a silicon oxide layer. Other suitable types of passivation layers, such as but not limited to doped silicon oxide or nitride, may also be useful. The silicon oxide layer is formed by, for example, CVD. Forming the silicon oxide layer using other techniques may also be useful.

After forming the silicon oxide layer, a plasma surface treatment is performed. The plasma treatment includes nitrogen containing plasma, such as $N_2$ or $NH_3/N_2$. Other nitrogen containing plasma may also be useful. In one embodiment, the plasma treatment causes nitridation to occur, forming a thin nitrided layer 176, such as silicon nitride or silicon oxynitride, on the surface of the first passivation sub-layer. For example, the plasma power (HFRF/LFRF), gas flow and duration can be selected to cause nitridation. In one embodiment, the plasma treatment is performed with $NH_3/N_2$ plasma at a pressure of about several Torr, gas flow of about 5,000-10,000 sccm $NH_3$ and 5,000-10,000 sccm $N_2$, and power of about 500-2,000 W for about 20-120 sec. Other suitable process parameters may also be useful.

In one embodiment, the nitrided layer is provided by a plasma surface treatment of the silicon oxide layer. As described, the nitrided layer is provided by a nitrogen containing plasma. Other types of nitrogen containing plasma may also be useful. The thin nitrided layer, for example, may have a different composition relative to a deposited silicon nitride as will be described later. The nitrided layer improves passivation by the passivation stack. This prevents, for example, corrosion or contamination of the top conductive layer, improving device reliability.

Figure 2F:
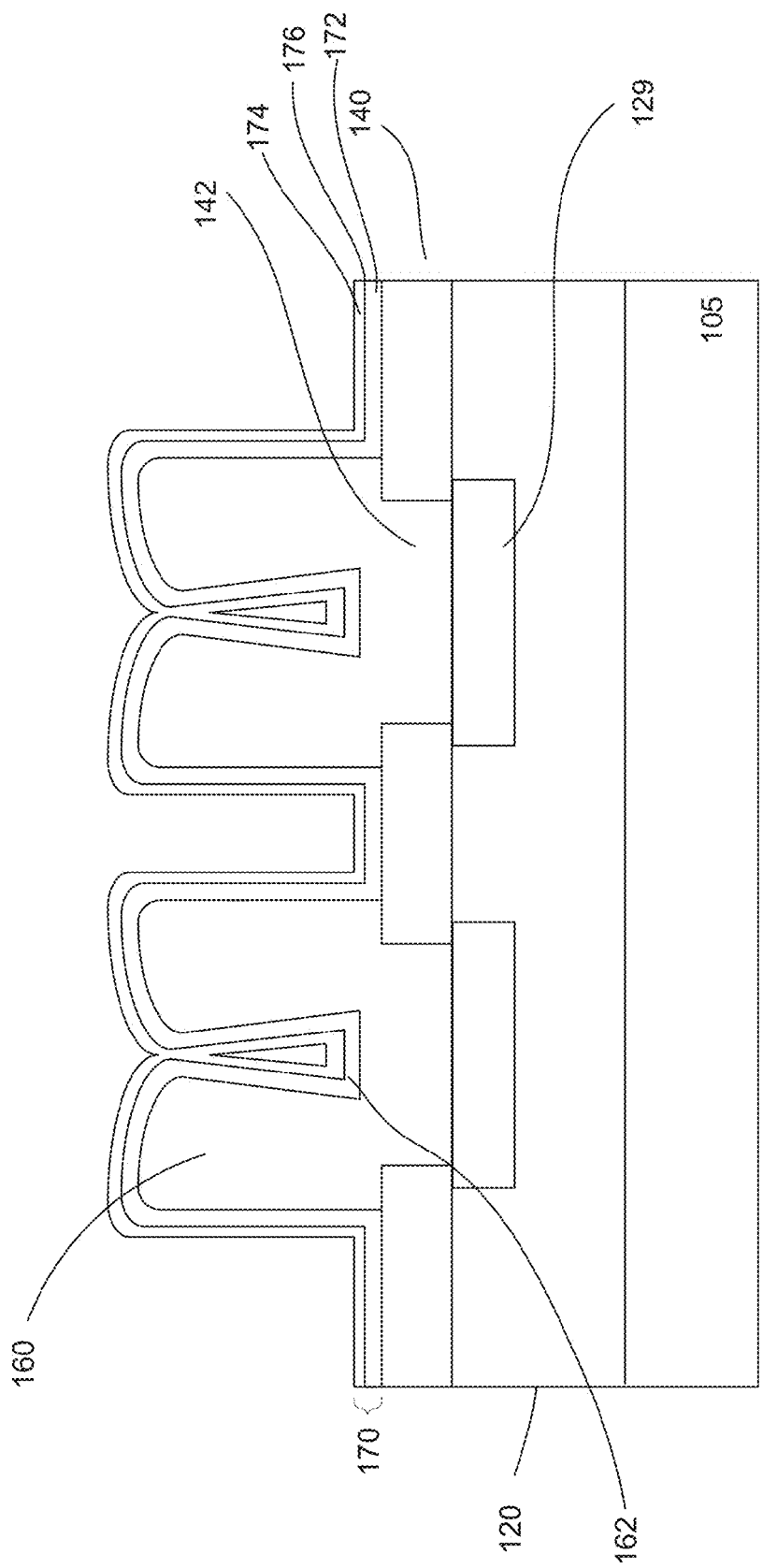

As shown in FIG. 2f, a second passivation sub-layer 174 is formed on the substrate over the plasma treated first passivation sub-layer. The first and second passivation sub-layers form a passivation stack 170. In one embodiment, the second passivation sub-layer is a silicon nitride layer. The silicon nitride layer may be formed by, for example, CVD. Other techniques for forming the second passivation sub-layer may also be useful. The thickness of the second passivation sub-layer should be sufficiently thick to protect the underlying top conductive layer. The second passivation sub-layer lines the first passivation sub-layer and may or may not seal the void. The thickness of the second passivation sub-layer, for example, may be about 4,000-10,000 Å. Other suitable thickness ranges may also be useful.

By performing the plasma treatment, a thin nitrided layer is formed on the surface of the first passivation sub-layer. This results in improved passivation integrity of the passivation stack. Although not to be bound by theory, it is believed that the plasma treatment may also drive N deep into the micro-cracks in the first passivation sub-layer, mostly around the geometric corners formed by the top conductive layer profile, generating bonding crosslink which seals the micro-cracks in the silicon oxide layer. Additionally, the nitrided layer may facilitate in modulating the subsequent silicon nitride deposition process, causing less stress to build up at the bottom corner. This in turn reduces or prevents micro-cracks forming in the silicon nitride layer. Furthermore, the plasma treatment may provide better coverage at the bottom and corners by the nitrided layer than CVD silicon nitride since CVD process will cause an overhang at the opening, hindering deposition.

Passivation integrity tests were performed on a test structure having 2 μm last top via (VV) with 2 μm VV spacing and the last interconnect (LB) with various LB spacing. The test structure is dipped into a chemical solution to check the integrity of the passivation film. It is understood and appreciated that the chemical solution can be varied. Devices were tested with two different passivation stacks. The first one includes silicon oxide at 8,000 Å thick, plasma treatment using $N_2/NH_3$ and silicon nitride of 6,000 Å thick while the second one includes silicon oxide at 10,000 Å thick, plasma treatment using $N_2/NH_3$ and silicon nitride of 6,000 Å. The devices passed passivation integrity tests.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A method for forming a semiconductor device comprising:
   providing a substrate, the substrate is prepared with a dielectric layer which includes a top metal level of the device, wherein the top metal level includes top level conductive lines;

forming a top dielectric layer over the top metal level, the top dielectric layer includes top via openings in communication with the top level conductive lines;

forming a patterned top conductive layer on the top dielectric layer, the patterned top conductive layer includes a top via in the top via opening and a top conductive line; and forming a passivation stack comprising
- depositing a first oxide passivation sub-layer to line the patterned conductive layer and exposed top dielectric layer,
- performing a plasma surface treatment on a surface of the first oxide passivation sub-layer to form a nitrided layer on the first oxide passivation sub-layer, and
- depositing a second nitride passivation sub-layer in direct contact with the nitrided layer, wherein the nitrided layer is separate and distinct from the second nitride passivation sub-layer and comprises a different composition than the deposited second nitride passivation sub-layer and improves the passivation integrity of the passivation stack.

2. The method of claim 1 wherein the patterned top conductive layer is formed by:
- forming a top conductive layer, wherein the top conductive layer fills the top via openings and cover the top dielectric layer; and
- patterning the top conductive layer by mask and etch technique to form the top via and top conductive line.

3. The method of claim 1 wherein the first oxide passivation sub-layer comprises silicon oxide or doped silicon oxide and the second nitride passivation sub-layer comprises silicon nitride.

4. The method of claim 3 wherein the thickness of the first oxide passivation sub-layer is about 6,000-14,000 Å and the thickness of the second nitride passivation sub-layer is about 4,000-10,000 Å.

5. The method of claim 1 wherein the plasma surface treatment comprises nitrogen containing plasma having $N_2$ or $NH_3/N_2$.

6. The method of claim 5 wherein performing the plasma surface treatment causes nitridation to occur on the surface of the first oxide passivation sub-layer and forms the nitrided layer.

7. The method of claim 1 wherein the top level conductive lines comprise Cu or Cu alloy and the patterned conductive layer comprises Al.

8. The method of claim 1 wherein the plasma surface treatment is performed with $NH_3/N_2$ plasma at a pressure of about several Torr, gas flow of about 5,000-10,000 sccm $NH_3$ and 5,000-10,000 sccm $N_2$, and power of about 500-2,000 W for about 20-120 sec.

9. The method of claim 1 wherein the nitrided layer on the first oxide passivation sub-layer comprises silicon nitride or silicon oxynitride.

10. The method of claim 1 wherein the patterned top conductive layer comprises a void above the top via.

11. A method for forming a semiconductor device comprising:
- providing a substrate prepared with a top dielectric layer which includes top via openings;
- forming a patterned top conductive layer on the top dielectric layer, the patterned top conductive layer includes a top via in the top via opening and a top conductive line, wherein the patterned top conductive layer serves as an external contact of the semiconductor device for coupling to an external substrate; and
- forming a passivation stack comprising
  - depositing at least a first passivation sub-layer to line the patterned conductive layer and exposed top dielectric layer, and
  - performing a plasma surface treatment on a surface of the first passivation sub-layer after depositing the first passivation sub-layer, wherein the plasma surface treatment causes nitridation to occur on the surface of the first passivation sub-layer to form a thin nitrided layer, wherein the thin nitrided layer facilitates in modulating a subsequent deposition process used for depositing a second passivation sub-layer on the first passivation sub layer.

12. The method of claim 11 comprising:
depositing a second passivation sub-layer over the first passivation sub-layer.

13. The method of claim 12 wherein the plasma surface treatment which forms the thin nitrided layer on the surface of the first passivation sub-layer is performed prior to depositing the second passivation sub-layer, wherein the thin nitrided layer is disposed between the first and second passivation sub-layers.

14. The method of claim 12 wherein the first passivation sub-layer comprises silicon oxide, doped silicon oxide or doped silicon nitride and the second passivation sub-layer comprises silicon nitride.

15. The method of claim 12 wherein the thickness of the first passivation sub-layer is about 6,000-14,000 Å and the thickness of the second passivation sub-layer is about 4,000-10,000 Å.

16. The method of claim 12 wherein the thin nitrided layer comprises composition which is different than the second passivation sub-layer.

17. The method of claim 11 wherein the substrate includes a dielectric layer having a top metal level of the device, wherein the top metal level includes top level conductive lines, wherein the top via of the patterned conductive layer is in communication with the top level conductive lines.

18. The method of claim 17 wherein the top level conductive lines comprise Cu or Cu alloy and the patterned conductive layer comprises Al.

19. The method of claim 11 wherein the patterned top conductive layer is formed by:
- forming a top conductive layer, wherein the top conductive layer fills the top via openings and cover the top dielectric layer; and
- patterning the top conductive layer by mask and etch technique to form the top via and top conductive line.

20. The method of claim 11 wherein the plasma surface treatment comprises nitrogen containing plasma having $N_2$ or $NH_3/N_2$.

* * * * *